United States Patent
Fabian et al.

[19]

[11] Patent Number: 5,915,985
[45] Date of Patent: Jun. 29, 1999

[54] TRAVELING ELECTRICAL CONNECTOR

[75] Inventors: David James Fabian, Mt. Joy; Richard Scott Kline, Harrisburg; Timothy Lee Kocher, Camp Hill, all of Pa.

[73] Assignee: The Whitaker Corporation, Wilmington, Del.

[21] Appl. No.: 08/841,883

[22] Filed: May 5, 1997

[51] Int. Cl.⁶ .................................................. H01R 13/64
[52] U.S. Cl. .......................................... 439/248; 361/609
[58] Field of Search .................................... 439/248, 247, 439/924.1, 347, 297; 361/607, 608, 609, 615

[56] References Cited

U.S. PATENT DOCUMENTS

| | | | |
|---|---|---|---|
| 4,236,189 | 11/1980 | Yosida | 361/337 |
| 4,743,715 | 5/1988 | Gerbert-Gaillard et al. | 361/337 |
| 4,941,841 | 7/1990 | Darden et al. | 439/377 |
| 5,036,427 | 7/1991 | Krom et al. | 361/339 |
| 5,199,892 | 4/1993 | Campbell et al. | 439/246 |
| 5,344,347 | 9/1994 | Inoue et al. | 439/924.1 |
| 5,477,415 | 12/1995 | Mitcham et al. | 361/686 |

Primary Examiner—Neil Abrams
Assistant Examiner—T C Patel
Attorney, Agent, or Firm—Katherine A. Nelson

[57] ABSTRACT

The electrical connector (24) of the present invention includes a coupling (26, 26') for attaching the connector (24) to an equipment cabinet (10) that will permit a certain amount of movement of the connector along the mating axis (64) after mating with a mating connector (32). The coupling (26, 26') includes U-shaped channels (68) attached to the cabinet that receive rollers (88) attached to the connector. The rollers have a V-shaped groove (98) that receives a circular portion (112) of a spring (108) for holding the connector (24) in position during mating but will expand allowing the mated connector pair (24, 32) to move along the mating axis (64) after mating.

16 Claims, 6 Drawing Sheets

TRAVELING ELECTRICAL CONNECTOR

The present invention relates to electrical connectors for electrically interconnecting removable components such as circuit breakers with other equipment in an equipment cabinet and more particularly to such connectors that are mated when the component is first inserted into the equipment cabinet a specific distance to an intermediate position and then the mated connectors are arranged to move along with the component as the component is further inserted into the equipment cabinet to its final position.

BACKGROUND OF THE INVENTION

In the electrical power distribution industry, as well as other industries, large equipment cabinets are provided containing electrical components that are electrically interconnected to other equipment in the cabinet. Some of these components, such as large circuit breakers, must be able to be temporarily disconnected and removed or simply disconnected and left in place. Such components are usually arranged on rails within the equipment cabinet which permit the component to slide into the equipment cabinet for electrical mating and out of the equipment cabinet for removal. For example, low voltage circuit breakers which handle up to about 600 volts AC and up to about 4000 amperes, are arranged to slide along the rails and are positionable in three distinct positions. In the first position the circuit breaker is within the equipment cabinet but not electrically mated. In the second position secondary contacts, which are used for control functions, are mated but the primary power contacts are spaced from their mating contacts, in the present example, a distance of 1.625 inches. And in the third position both the secondary and primary contact are mated. These three positions are known in the industry as the disconnect position, test position, and connect position, respectively. As the circuit breaker is moved along the rails from the second to third positions, The secondary contacts must remain mated. To accomplish this one half of the secondary contact connector which is attached to the equipment cabinet has elongated contacts that extend along the direction of travel a distance greater than the 1.625 inches so that when the circuit breaker is in the test position the contacts of the connector attached to the circuit breaker are in engagement with respective ones of the elongated contacts. As the circuit breaker is moved toward and into its connect position, these secondary contacts slide along the elongated contacts and remain mated. These secondary contacts must be able to carry electrical loads of up to 600 volts AC or DC and current levels of up to 10 amperes. Therefore, the elongated secondary contacts are relatively large having long contacting surfaces which are usually silver plated. Such contacts are costly to manufacture and require substantial room within the equipment cabinet.

What is needed is a secondary connector having conventional length secondary contacts that will mate when the circuit breaker is moved from its disconnect position into its test position, and will remain mated while the circuit breaker is further moved into its connect position. Conversely, the secondary contacts must remain mated while the connector is moved from its connect position back into its test position, and should break contact when the circuit breaker is further moved from its test position to its disconnect position.

SUMMARY OF THE INVENTION

An electrical connector is coupled to an equipment cabinet and arranged to mate with a mating connector attached to a component that is inserted into an opening in the cabinet. The connector includes a first housing having a plurality of first electrical contacts arranged therein and adapted for mating along a mating axis of the connector with respective ones of a plurality of second electrical contacts in a second housing of the mating connector. The connector is coupled to the equipment cabinet by means of a coupling having a mounting surface for securing it to the cabinet. The coupling is arranged so that the connector is movable with respect to the mounting surface along the mating axis from an extended position to a retracted position while remaining mated to the mating connector.

DESCRIPTION OF THE PREFERRED EMBODIMENT

Figure 1:
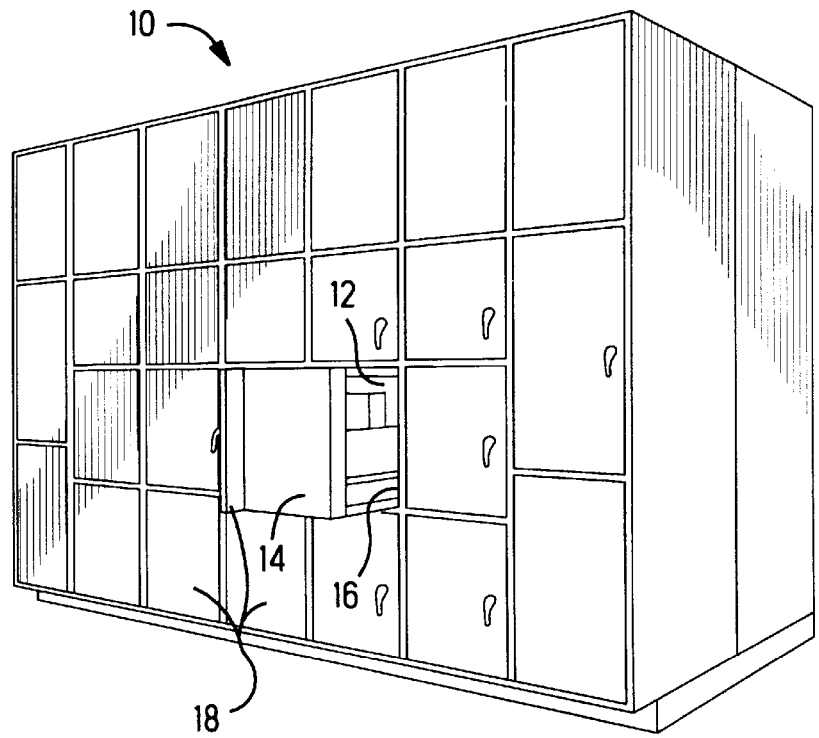
FIG. 1 is an isometric view of an equipment cabinet incorporating the teachings of the present invention.

There is shown in FIG. 1 an equipment cabinet 10 of the type used for holding power switchgear for low voltage power distribution. The cabinet 10 includes an array of bays 12 for holding circuit breakers 14 which are arranged to slide along rails 16 into and out of the bays. Each bay 12 includes a door 18 that is hinged to the cabinet 10 and completely covers the open end of the bay when closed. The door 18 may be opened to gain access to the circuit breaker within the bay for maintenance, for placing the circuit breaker in operation, or for removing it from operation. While power switchgear is used to describe the present invention, it will be understood that this is by way of example only and that the teachings of the present invention may be advantageously utilized with other types of equipment as well.

Figure 2:
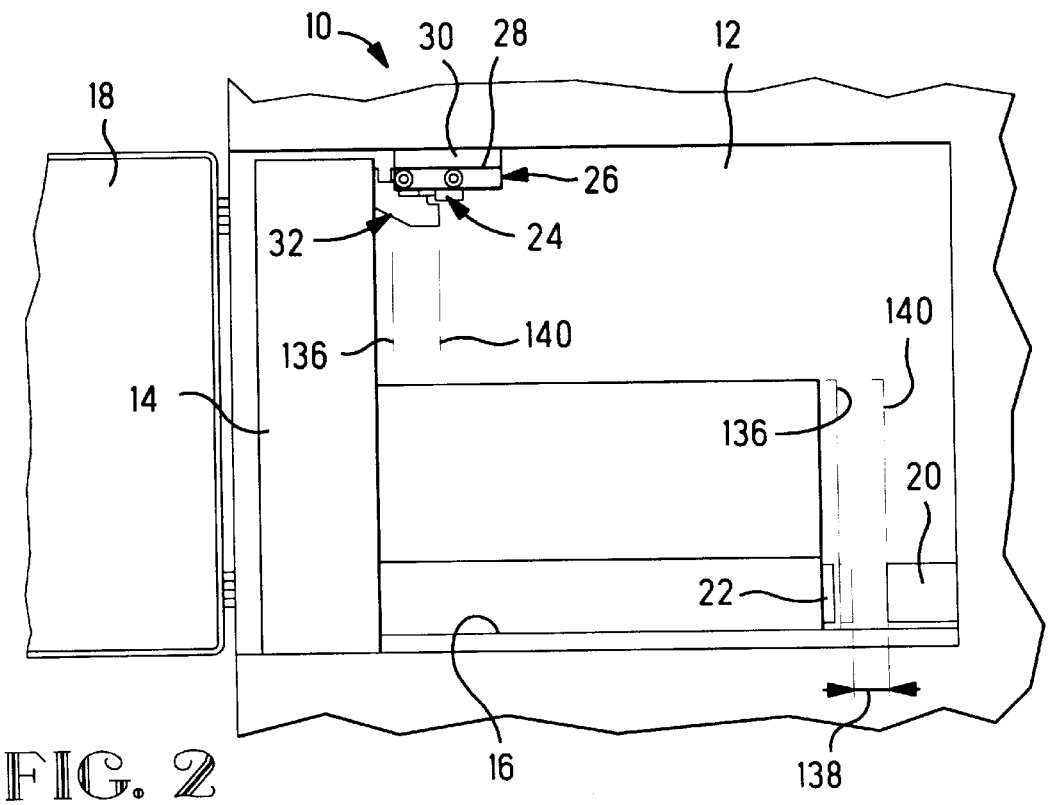
FIG. 2 is a schematic representation of a cross-sectional view showing one of the circuit breakers within the cabinet.

As best seen in FIG. 2 the circuit breaker 14 is shown fully within the bay 12 in a first position, known as the disconnect position, with the door 18 open. A primary electrical connector 20 is attached to structure of the cabinet 10 within the bay 12, and carries the power that is to be protected by the circuit breaker 14. A mating primary connector 22 is attached to and carried by the circuit breaker 14 for mating with the connector 20 when the circuit breaker 14 is fully inserted into the bay 12 in a third position, known as the connect position, as will be explained in further detail below. A secondary electrical connector 24 is coupled to the cabinet 10 within the bay 12 by means of right and left coupling assemblies 26 and 26', respectively, which have mounting surfaces 28 and 28' that are secured to brackets 30 by screws or other suitable means. A mating secondary connector 32 is attached to and carried by the circuit breaker 14 for mating with the connector 24 when the circuit breaker is in a second position, known as the test position, as will be explained below.

Figure 3:
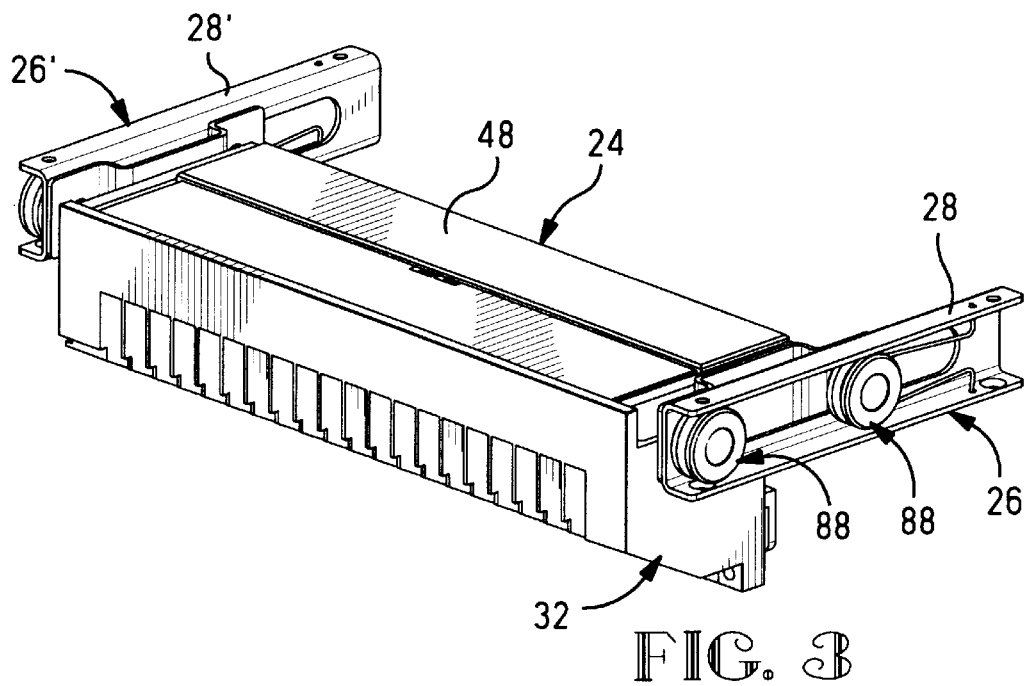
FIG. 3 is an isometric view of the connector of the present invention in mated engagement with a mating connector.
Figure 4:
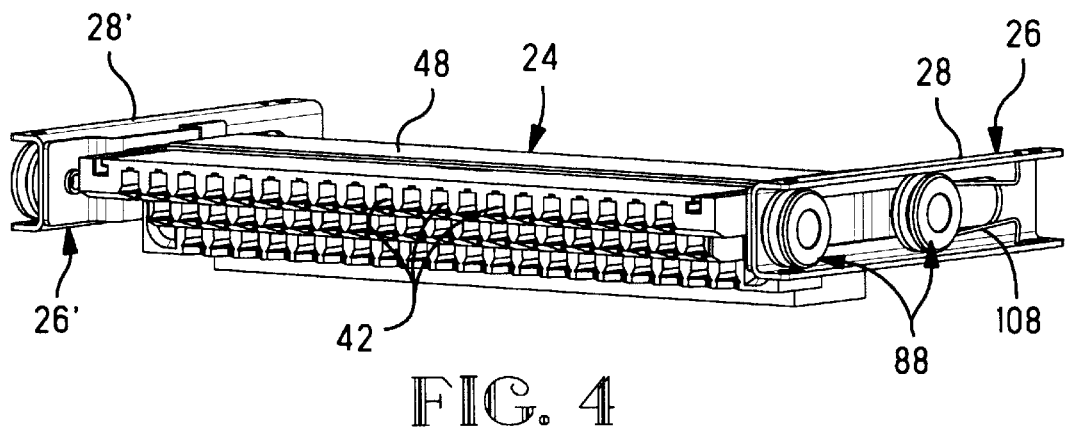
FIG. 4 is an isometric view of the connector of the present invention.
Figure 5:
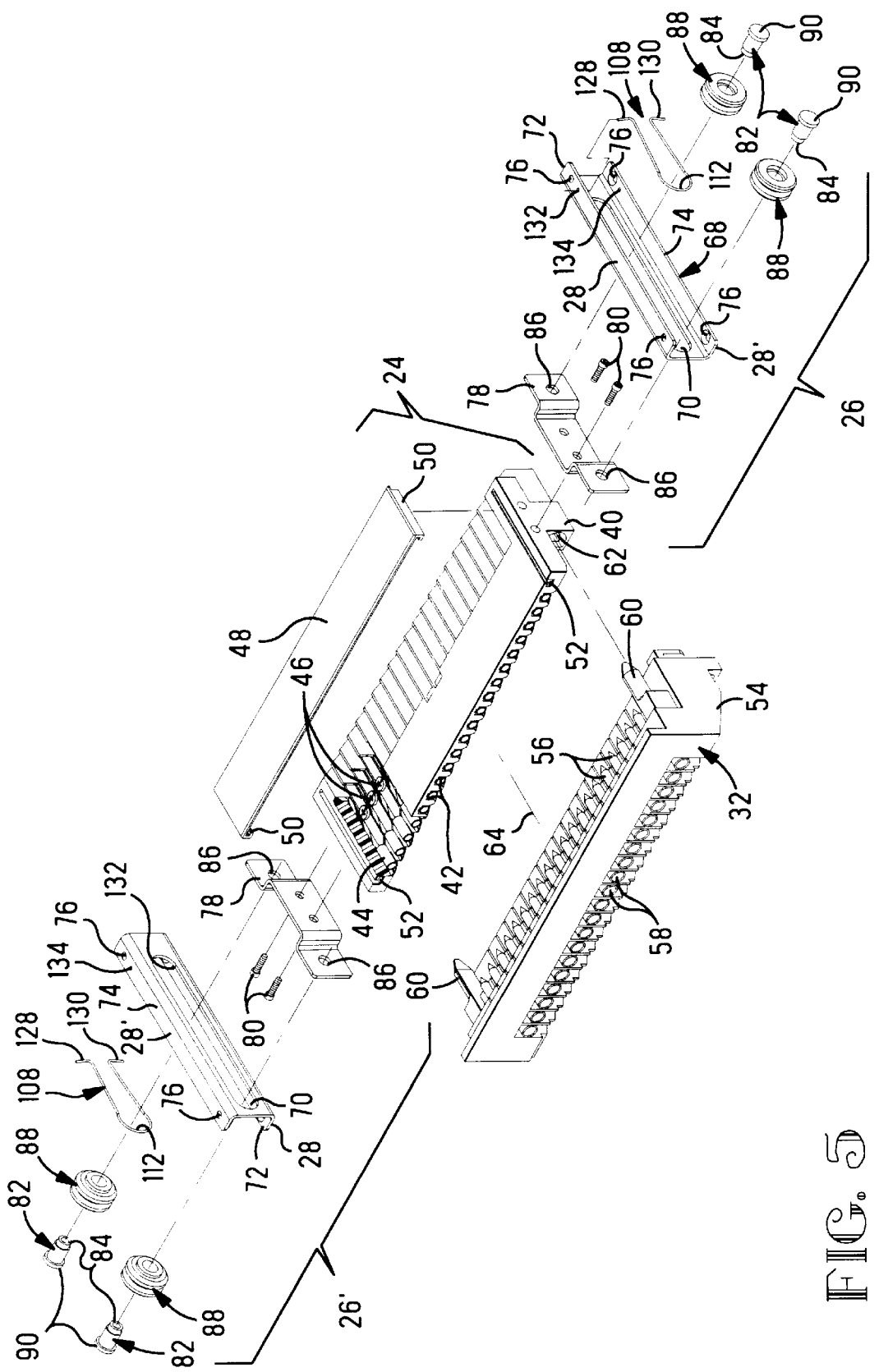
FIG. 5 is an exploded parts view of the connectors shown in FIG. 3.
Figure 7:
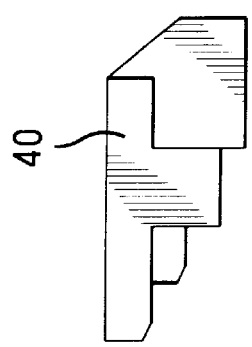
FIGS. 6, 7, and 8 are front, side, and top views, respectively, of the connector housing shown in FIG. 5.
Figure 8:
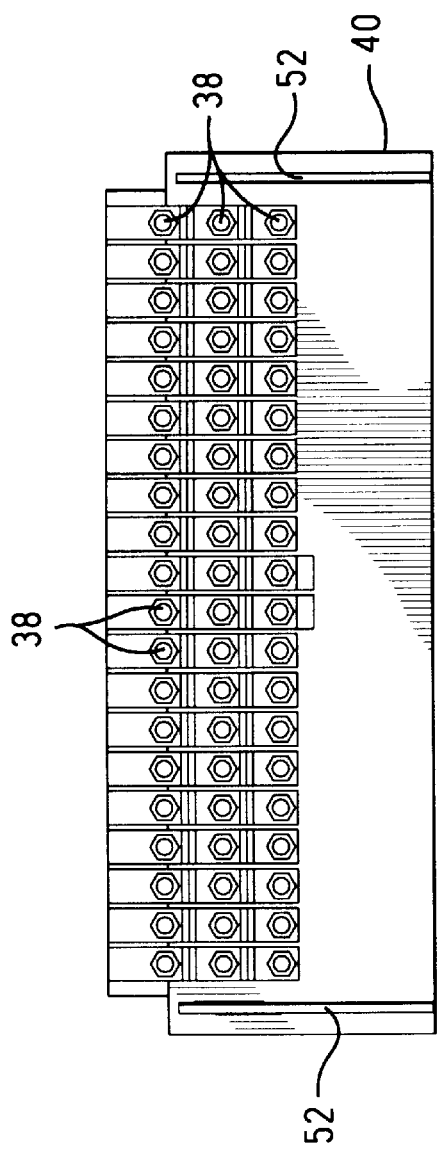
Figure 6:
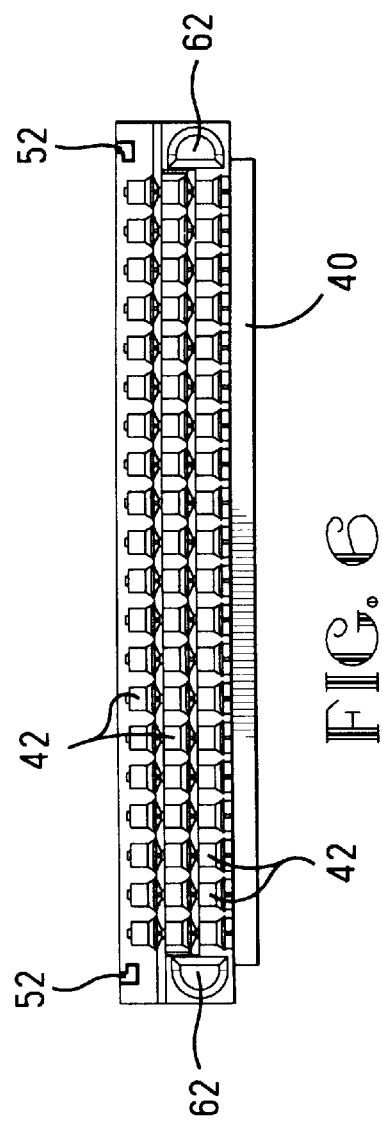

The secondary connector 24 with its attached right and left coupling assemblies 26 and 26', is shown mated to the mating secondary connector 32 in FIG. 3, and is shown without the mating connector 32 in FIG. 4. Note that both of these views omit the cabinet 10 and circuit breaker 14. The major elements of the mated connector, as shown in FIG. 3, are shown in exploded format in FIG. 5. The secondary connector 24, as shown in FIG. 5, includes a first housing 40 having a plurality of openings 42, each of which contains a respective first electrical contact 44. The contacts 44 include terminals 46 to which conductors may be attached in the usual manner, for electrically interconnecting the contacts 44 to circuitry within the cabinet 10. The secondary connector housing 40, as best seen in FIGS. 6, 7, and 8 has its contact openings 42 arranged in three rows. Each opening 42 extends through the housing and terminates in another opening 38 that receives the terminal 46 of each contact 44. A protective cover 48, having turned down edges 50, is arranged to slidingly engage two channels 52 formed in the housing 40 and to cover the terminals 42, as shown in FIGS. 3 and 4. The mating secondary connector 32 includes a second housing 54 having a plurality of second contacts 56 arrange to mate with respective ones of the contacts 44. The contacts 56 include terminals 58 to which conductors may be attached in the usual manner, for electrically interconnecting the contacts 56 to circuitry within the circuit breaker 14. A pair of alignment pins 60 project from the second housing 54 and serve to align the two connectors during mating by entering respective alignment openings 62 formed in the first housing 40 as the mating connector 32 moves along a mating axis 64.

Figure 11:
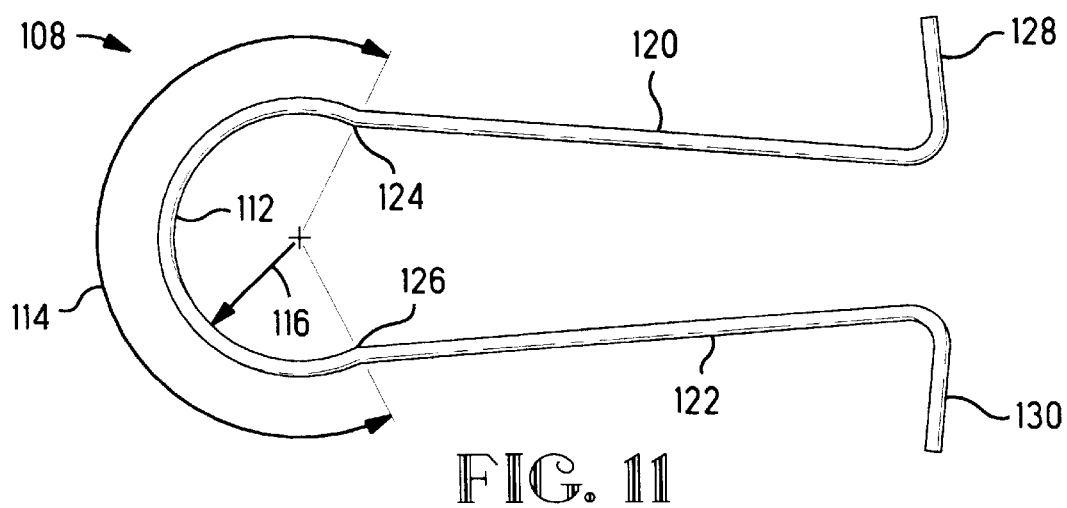
FIG. 11 is a plan view of the spring member shown in FIG. 5.
Figure 9:
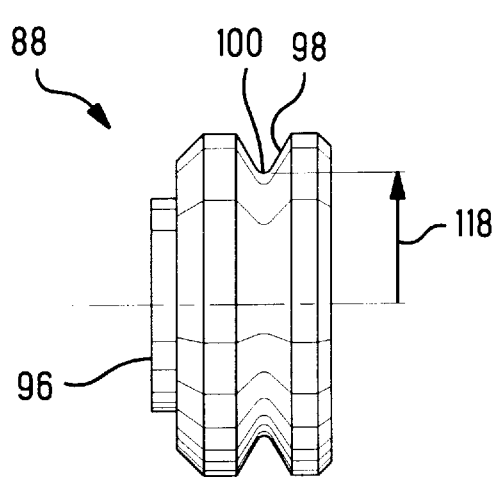
FIGS. 9 and 10 are side and end views, respectively, of the roller shown in FIG. 5.
Figure 10:
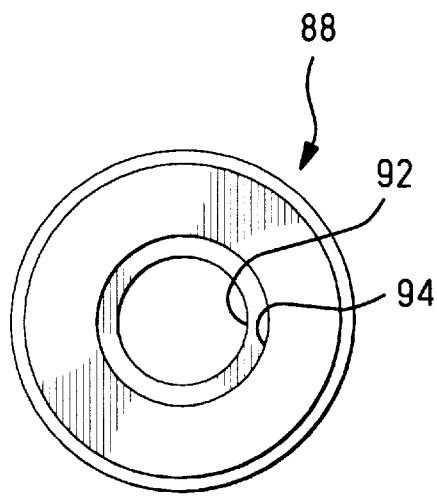
Figure 12:
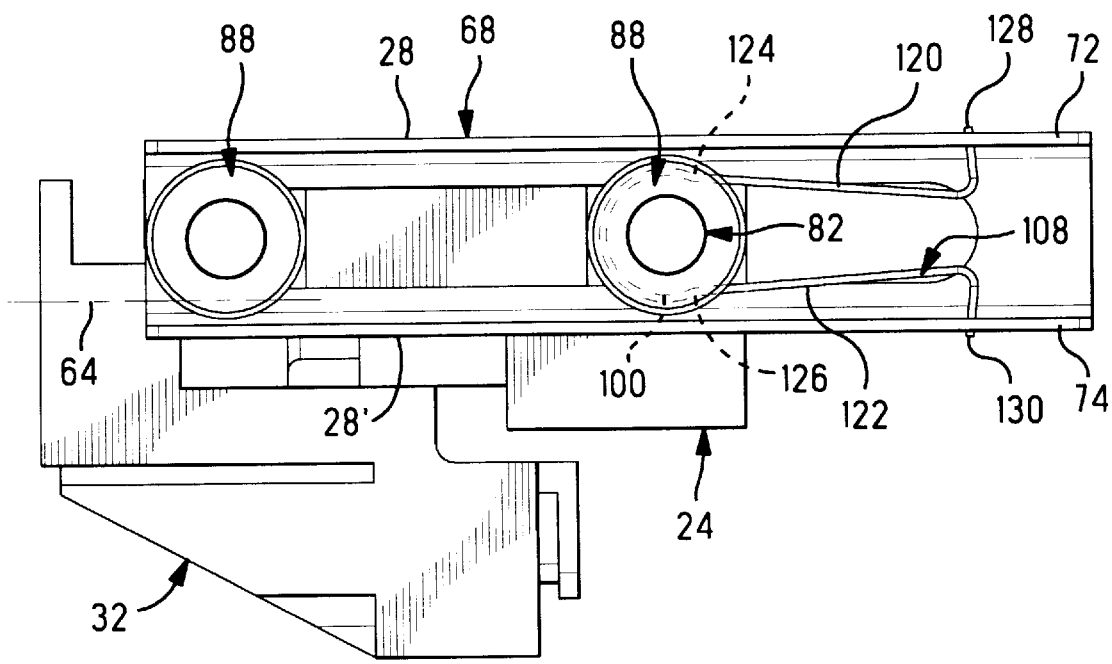
FIGS. 12, 13, and 14 are end views of the connector and mating connector, as shown in FIG. 2, showing the connectors in three operating positions.

In the following discussion the right coupling assembly 26 will be described, however, it will be understood that the left coupling assembly 26' is substantially identical having similar parts. The right coupling assembly 26 includes a U-shaped channel 68 having an elongated opening 70 formed parallel to the mating axis 64. The channel 68 includes flanges 72 and 74 containing holes 76 for receiving screws for securing the mounting surface 28 of the flange 72 to the bracket 30, as shown in FIG. 2. Optionally, a mounting surface 28' of the flange 74 may be similarly secured to the bracket 30 or other structure attached to the cabinet 10. The right coupling assembly 26 includes a mounting bracket 78 that is attached to the end of the first housing 40 by screws 80 or by any other suitable means such as staking or adhesive. A pair of pins 82 project outwardly from the mounting bracket 78 and through the elongated opening 70 in the channel 68. The pins 82 are secured to the bracket 78 by means of reduced diameters 84 that extend through spaced holes 86 formed in the bracket and are peened over or otherwise deformed. Optionally, the pins 82 may be attached directly to the ends of the housing 40 thereby eliminating the need for the mounting brackets 78. The attachment may be by any suitable means such as insitu molding or pressing separate pins into holes in the housing. Each pin 82 includes a roller 88 journaled for rotation thereon and, in the present example, held in place by an enlarged head 90. The rollers 88 have outside diameters that are sized to be received between the opposing surfaces of the two flanges 72 and 74, as shown in FIGS. 3 and 4. Each of the rollers 88, as best seen in FIGS. 9 and 10 includes a hole 92 that is a slip fit with its respective pin 82 and a counterbore 94 that receives the head 90 with clearance. A hub 96 is formed on the opposite side of the roller and extends through the elongated opening 70 in the channel 68. Additionally, each roller 88 includes a V-shaped groove 98 formed in its peripheral surface having a radius 100 at its apex. A U-shaped spring, made of wire having a cross-sectional radius that is equal to or less than the radius 100, is arranged so that a partial circular portion 112 wraps around the roller 88 and nestles into the radius 100 at the apex of the V-shaped groove. The circular portion 112 wraps around the roller 88 an angular amount 114 in excess of 180 degrees, in the present example the angular amount is about 210 degrees. In its free state, as viewed in FIG. 11, the portion 112 has an inside radius 116 that is slightly smaller than the radius 118 of the bottom of the V-shaped groove 98, as shown in FIG. 9. This permits the partial circular portion 112 to tightly engage the bottom of the V-shaped groove 98 for the full angular amount 114 when in the position shown in FIG. 4. The spring 108 has relatively long legs 120 and 122 extending from junctions 124 and 126, respectively. The legs 120 and 122 terminate in outwardly turned stub ends 128 and 130 that extend through clearance holes 132 and 134 formed in the flanges 72 and 74, respectively. The purpose of these stub ends is to retain the spring 108 in proper alignment as the circuit breaker 14 is moved between its first, second, and third positions, as will be explained in more detail below. It will be noted that only one of the two rollers 88 on each side of the secondary connector 24 is in engagement with a spring 108. The other roller on each side need not have the V-shaped groove 98, and instead may have a simple cylindrically shaped surface, as desired. An advantage in having the V-shaped groove in all rollers is that there are fewer different parts to manufacture and inventory.

Figure 13:
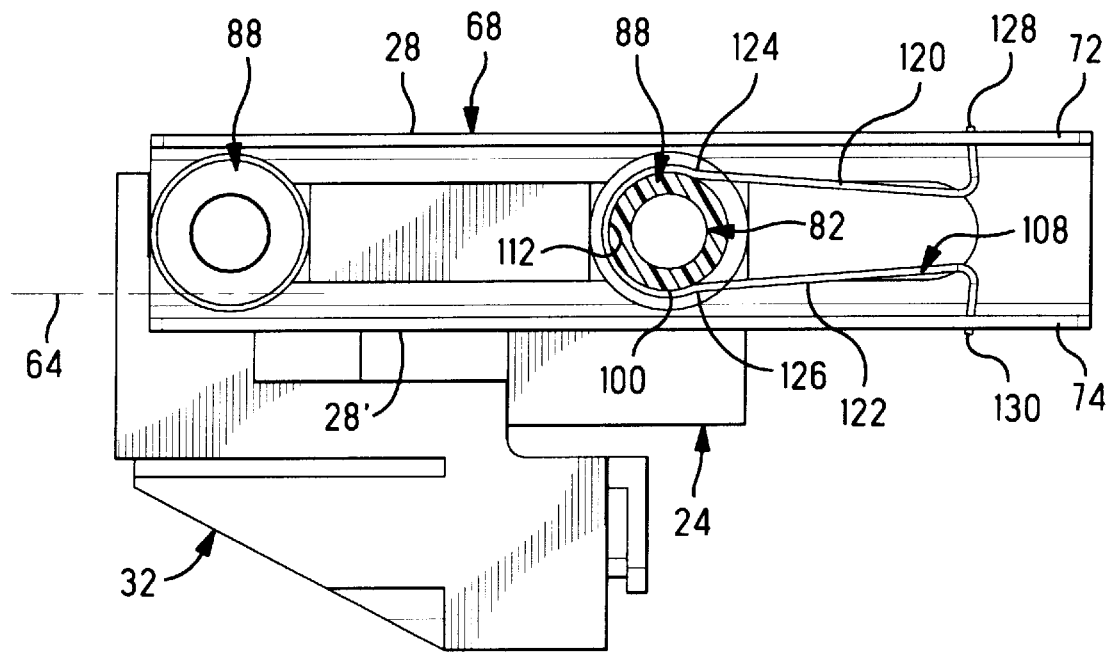
Figure 14:
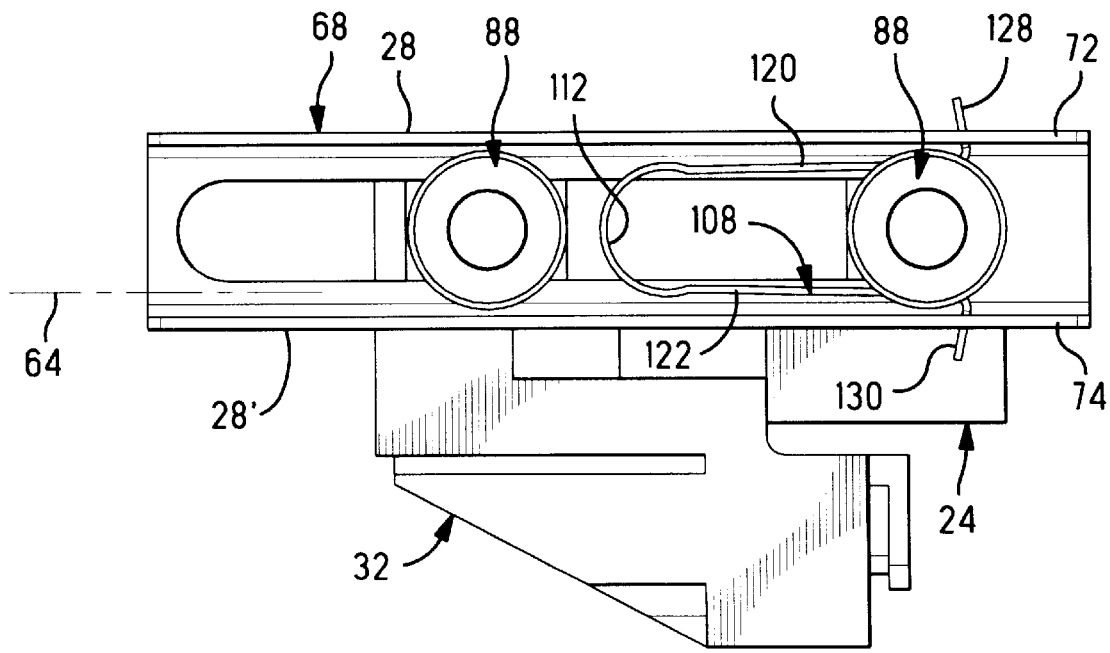

The operation of the secondary connector 24 and coupling assemblies 26 and 26' will now be described with reference to FIGS. 2, and 9 through 14. As shown in solid lines in FIG. 2, the circuit breaker 14 is in its first or disconnect position within the bay 12 where both the primary connectors 20, 22 and the secondary connectors 24, 32 are unmated. In this position the secondary connector 24 and mating connector 32 are separated by a distance of about 0.500 inch. As the circuit breaker 14 is moved toward the right along the rails 16 it moves into its second or test position, shown in phantom lines 136 in FIG. 2. During this movement of the circuit breaker the secondary mating connector 32 moves from the position shown in FIG. 12, toward and into engagement with the secondary connector 24, and finally into full mated engagement therewith as shown in FIG. 13. There are normally about 60 contacts 44 in the secondary connector 24, each having a maximum mating force of about one half pound, resulting in a total mating force for the secondary connector of about 30 pounds or less. However, in certain cases there may be as few as five or six contacts 44 resulting in a total mating force for the secondary connector of about 3 pounds or less. The two springs 108 resist this mating force by virtue of their circular portions 112 being in engagement with the V-shaped grooves 98 of their respective rollers 88, as shown in FIG. 13. This prevents movement of the secondary connector 24 along the mating axis 64 during this mating with the mating connector 32. At this point the primary mating connector 22 is still spaced from the primary connector 20 by a distance 138 that is equal to about 1.625 inches. As the circuit breaker 14 is further moved along the rails 16 toward the right, as viewed in FIG. 2, the right most rollers 88, as viewed in FIG. 13 are forced against the junctions 124 and 126 causing the circular portion 112 to expand so that the legs 120 and 122 move apart, the stub ends 128 and 130 simply extending further through their respective holes 132 and 134. When the circular portion 112 expands sufficiently far, the distance between the two junctions 124 and 126 is great enough to allow the roller 88 to pass and move toward the right to the position shown in FIG. 14, which is the third or connect position of the circuit breaker 14, as shown in phantom lines 140 in FIG. 2. As the roller 88 moves from the position in FIG. 13 to the position in FIG. 14 the V-shaped groove 98 of the roller tracks along the legs 120 and 122 and maintains the spring 108 in proper alignment. Additionally, during this movement there is very little resistance offered by the spring 108 as the circuit breaker is moved from its test position to its connect position. It is important that the angle 114 of the circular portion 112 be chosen so that the junctions 124 and 126 are effective in inhibiting movement of the secondary connector 24 along the mating axis 64 while the mating connector 32 is moved into mating engagement therewith, but will allow these junctions to separate sufficiently so that the circuit breaker 14 can be moved from its test position to its connect position without further substantial resistance from the couplings 26 and 26'. When the circuit breaker 14 is moved from its connect position shown in FIG. 14 and in phantom lines 140 in FIG. 2, to its test position shown in FIG. 13 and in phantom lines 136 in FIG. 2, the rollers 88 simply track along the legs 120 and 122 of the springs 108 until they fully engage the circular portions 112, as best seen in FIG. 13. Importantly, during this movement there is very little resistance offered by the spring 108 so that the secondary connector 24 is pulled along with the mating connector 32 without danger of unmating, even in the case where a low pin count results in a relatively low mating force. It will be appreciated that the spring 108 and associated roller 88 are uniquely arranged to provide a maximum of resistance in one direction and a minimum of resistance in the opposite direction. The maximum resistance is required when a 60 pin mating connector 32 is moved into mating engagement with a 60 pin connector 24. The minimum resistance is required during movement of the circuit breaker from the connect position to the test position when the connector has only 5 or 6 pins resulting in only 3 pounds of mating force to hold the two connectors together. At this point the circuit breaker is in the test position with the secondary connectors 24 and 32 still mated and the primary connectors 20 and 22 disconnected and spaced apart by the distance 138. When the circuit breaker 14 is moved from its test position to its disconnect position, shown in FIG. 12 and in solid lines in FIG. 2, the two springs 108 retain the secondary connector 24 in position with respect to their respective U-shaped channels 68 so that the mating connector 32 must disengage during the last portion of the movement of the circuit breaker.

An important advantage of the present invention is that the contacts of the secondary connector are of conventional length and will mate when the circuit breaker is moved from its disconnect position into its test position, and will remain mated while the circuit breaker is further moved into its connect position, or conversely when it is moved from its connect position to its test position. This substantially reduces the overall size of the secondary connector and importantly reduces its cost to manufacture and to maintain. Further, in the case where the total mating force is relatively low due to a low pin count, the mating force is still sufficient to overcome the resistance of the spring and roller to hold the mated secondary connectors in mated engagement while the circuit breaker is moved from its connect position to its test position.

We claim:

1. A connector including a first housing having a plurality of first electrical contacts arranged therein and adapted for mating along a mating axis of said connector with respective ones of a plurality of second electrical contacts in a second housing of a mating connector, said connector including a coupling having a mounting surface for securing to an equipment cabinet, said coupling arranged so that while said connector is mated with said mating connector said connector is movable with respect to said mounting surface along said mating axis from an extended position to a retracted position, said coupling including left and right rails and rollers extending from opposite ends of said first housing, the roller being journaled for rotation on the rails.

2. The connector according to claim 1 including a detent associated with said coupling for urging said connector to remain in said extended position unless a force greater than a predetermined level of force moves said connector toward said retracted position.

3. The connector according to claim 2 wherein said connector and said mating connector requiring a mating force for effecting mating thereof that is less than said predetermined level of force.

4. The connector according to claim 3 wherein said mating force is equal to or less than about 0.5 pounds per contact.

5. The connector according to claim 2 wherein said rollers extend from left and right opposite ends of said first housing through elongated openings in said left and right rails, respectively, each of said left and right rails having a surface that is a portion of said mounting surface.

6. The connector according to claim 5 wherein each of said left and right rails includes at least one surface in guiding engagement with a respective one of said rollers for guiding said connector when said connector is moved along said mating axis.

7. The connector according to claim 6 wherein each of said at least one surface is two opposing surfaces arranged on opposite sides of said respective one roller.

8. The connector according to claim 7 wherein said coupling includes a spaced apart pair of said projections extending from each of said left and right opposite ends, each said projection having a respective said roller journaled for rotation thereon and wherein said two opposing surfaces of each said left and right rails are arranged on opposite sides of a respective pair of rollers.

9. The connector according to claim 6 wherein said detent includes a groove in at least one of said rollers and a U-shaped spring in engagement with said groove.

10. The connector according to claim 9 wherein said U-shaped spring provides a substantial resistance to movement of said connector along said mating axis when said connector is in said extended position and substantially less resistance to said movement when said connector is being moved from said retracted position toward said extended position.

11. The connector according to claim 9 wherein said groove is a V-shaped groove having a radiused bottom at its apex and said U-shaped spring has a circular cross section having a radius equal to or less than said radiused bottom.

12. The connector according to claim 9 wherein said circular portion has a free state diameter and said V-shaped groove has a radiused bottom having another diameter that is equal to or larger than and said free state diameter of said circular portion.

13. The connector according to claim 9 wherein said U-shaped spring includes a circular portion that is in engagement with an angular portion of said V-shaped groove exceeding 180 degrees.

14. The connector according to claim 13 wherein said U-shaped spring includes two spaced legs, each of which intersects said circular portion thereby forming two junctions spaced apart a specific distance.

15. The connector according to claim 14 wherein said V-shaped groove has a bottom having a diameter that is larger than and said specific distance.

16. The connector according to claim 15 wherein said U-shaped spring includes two stub ends, one stub end extending outwardly from each leg in substantially opposite direction, each stub end extending through a respective hole in one of said left and right rails.

* * * * *